US008724418B2

(12) United States Patent
Kim et al.

(10) Patent No.: US 8,724,418 B2
(45) Date of Patent: May 13, 2014

(54) MEMORY CELL OF SEMICONDUCTOR MEMORY DEVICE AND METHOD FOR DRIVING THE SAME

(75) Inventors: Tae-Hoon Kim, Gyeonggi-do (KR); Sung-Mook Kim, Gyeonggi-do (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 70 days.

(21) Appl. No.: 13/461,186

(22) Filed: May 1, 2012

(65) Prior Publication Data

US 2013/0182518 A1    Jul. 18, 2013

(30) Foreign Application Priority Data

Jan. 18, 2012   (KR) .................. 10-2012-0005879

(51) Int. Cl.
*G11C 17/16* (2006.01)
*G11C 17/18* (2006.01)
*G11C 29/02* (2006.01)
*G11C 29/00* (2006.01)

(52) U.S. Cl.
CPC ............... *G11C 17/16* (2013.01); *G11C 17/18* (2013.01); *G11C 17/165* (2013.01); *G11C 29/027* (2013.01); *G11C 29/787* (2013.01)
USPC ......................................... 365/225.7; 365/63

(58) Field of Classification Search
CPC ...... G11C 17/16; G11C 17/18; G11C 17/165; G11C 29/027; G11C 29/787
USPC .................................................. 365/63, 225.7
See application file for complete search history.

(56) References Cited

U.S. PATENT DOCUMENTS

| 5,790,462 A * | 8/1998 | McClure ................. 365/189.02 |
| 7,907,465 B2 | 3/2011 | Peng et al. |
| 2004/0125638 A1* | 7/2004 | Lin et al. ........................ 365/96 |
| 2009/0316466 A1* | 12/2009 | Xu et al. ........................ 365/96 |

FOREIGN PATENT DOCUMENTS

| KR | 1020080049717 | 6/2008 |
| KR | 1020110048833 | 5/2011 |
| KR | 1020110076551 | 7/2011 |
| KR | 1020110077562 | 7/2011 |

* cited by examiner

*Primary Examiner* — Ly D Pham
(74) *Attorney, Agent, or Firm* — IP & T Group LLP

(57) ABSTRACT

A semiconductor memory device includes a first fuse having one end coupled with a first bit line and configured to be programmed with a data, a second fuse having one end coupled with a second bit line and configured to be programmed with the data; a program controller coupled with the other ends of the first fuse and the second fuse and configured to perform a program operation on at least one of the first fuse and the second fuse in response to a program voltage, and a read controller coupled with the other ends of the first fuse and the second fuse and configured to perform a read operation on the first fuse and the second fuse in response to a read voltage.

20 Claims, 3 Drawing Sheets

MEMORY CELL OF SEMICONDUCTOR MEMORY DEVICE AND METHOD FOR DRIVING THE SAME

CROSS-REFERENCE TO RELATED APPLICATIONS

The present application claims priority of Korean Patent Application No. 10-2012-0005879, filed on Jan. 18, 2012, which is incorporated herein by reference in its entirety.

BACKGROUND

1. Field

Exemplary embodiments of the present invention relate to a semiconductor designing technology, and more particularly, to a memory cell of a semiconductor memory device and a method for driving the memory cell.

2. Description of the Related Art

Generally, a non-volatile memory device, such as an Erasable Programmable Read Only Memory (EPROM), Electrically Erasable Programmable ROM (EEPROM) and flash memory, is used for a main control unit (MCU), a power integrated circuit (IC), a display driving chip, a CMOS image sensor, and the like. However, fabrication of a non-volatile memory device may include additional processes that cause long turn-around time (TAT), an increase in the fabrication complexity, and a decrease in the fabrication reliability and cost. Therefore, a One-Time Programmable (OTP) memory device fabricated without an additional process is widely used. An OTP memory device may be programmed with a data, for example, only once per memory cell, and the programmed data is retained even though power is turned off. The OTP memory device is used for storing trimming information, security identification (ID), chip ID, and calibration data or used as a redundancy memory device of a main memory device.

Meanwhile, the OTP memory device may be divided into a memory device that may be designed based on an electrical fuse scheme logic process and a memory device that may be designed based on an anti-fuse scheme logic process.

Memory cells of the OTP memory device of an anti-fuse scheme are programmed by applying a higher voltage than a breakdown voltage to a thin gate oxide layer for an electrical short circuit. In other words, the OTP memory device of an anti-fuse scheme uses a high voltage during a program operation. For example, a voltage of approximately 5.5V to approximately 8.5V is used as a program voltage. The memory cells of the OTP memory device of an anti-fuse scheme have high data reliability and yield characteristics, but the memory cells of the OTP memory device of an anti-fuse scheme may have restrictive usage in a low voltage environment, such as a CMOS device. This is because a constituent element such as a logic transistor does not endure high program voltage.

On the other hand, memory cells of the OTP memory device of an electrical fuse scheme blow and cut off an electrical fuse by applying an over-current of approximately 10 mA to approximately 20 mA to a polysilicon gate. For example, the memory cells of the OTP memory device of an electrical fuse scheme are designed to be programmed with a program voltage of approximately 3.3V.

FIG. 1 illustrates a memory cell of a conventional OTP memory device of an electrical fuse scheme.

Referring to FIG. 1, a memory cell structure 10 includes an electrical fuse 12 and an NMOS transistor 14. The electrical fuse 12 has its anode coupled with a bit line BL and a cathode coupled with a coupling node CN. The NMOS transistor 14 includes a gate coupled with a word line WL and a drain-source path coupled between the coupling node CN and a ground voltage VSS end.

Hereinafter, a method for driving the memory cell structure 10 having the above structure during a program operation and a read operation is described.

First, a program operation is described.

As a program voltage is applied to the bit line BL and the word line WL, a program current flows through the electrical fuse 12 and the NMOS transistor 14. When the program current flows for a given time, the electrical fuse 12 is blown and electrically disconnected. For example, the electrical fuse 12 has a resistance of approximately $50\Omega$ to approximately $100\Omega$ before the program operation while the electrical fuse 12 comes to have a resistance of approximately over 100 kφ after the program operation. As described above, the electrical fuse 12 is programmed to be any one between a conductive state and a highly resistive state.

Second, a read operation is described below.

When a read voltage is applied to the word line WL while the bit line BL is pre-charged with a given voltage, the pre-charged voltage level of the bit line BL is decreased or maintained depending on whether the electrical fuse 12 is programmed to be in the conductive state or the highly resistive state. Here, a data is outputted by sensing the state of the pre-charged voltage level of the bit line BL.

However, the memory cell structure 10 of the conventional semiconductor memory device using an electrical fuse may have its data reliability and yield characteristics lower than a memory cell structure of a semiconductor memory device of an anti-fuse scheme.

Therefore, a memory cell structure of a semiconductor memory device having excellent data reliability and yield characteristics, while having applicability to a low-voltage environment is being developed.

SUMMARY

An embodiment of the present invention is directed to a memory cell of a semiconductor memory device with improved data reliability and yield characteristics based on an electrical fuse scheme, and a method for driving the memory cell.

In accordance with an embodiment of the present invention, a semiconductor memory device includes: a first fuse having one end coupled with a first bit line and configured to be programmed with a data; a second fuse having one end coupled with a second bit line and configured to be programmed with the data; a program controller coupled with the other ends of the first fuse and the second fuse and configured to perform a program operation on at least one of the first fuse and the second fuse in response to a program voltage; and a read controller coupled with the other ends of the first fuse and the second fuse and configured to perform a read operation on the first fuse and the second fuse in response to a read voltage.

In accordance with another embodiment of the present invention, a memory cell of a semiconductor memory device includes: a first fuse including one end coupled with a first bit line; a second fuse including one end coupled with a second bit line; a first switching unit configured to electrically connect each of the other ends of the first fuse and the second fuse to a set voltage end in response to a program voltage that is applied through a first word line; and a second switching unit configured to electrically connect the other ends of the first fuse and the second fuse with each other in response to a read voltage that is applied through a second word line.

In accordance with yet another embodiment of the present invention, a method for driving a memory cell of a semiconductor memory device including a first fuse and a second fuse, includes: applying a high power supply voltage to a first bit line coupled with one end of the first fuse during a first duration, and applying a low power supply voltage to the other end of the first fuse during the first duration in response to a program voltage that is applied through a first word line; and performing a read operation on the first fuse and the second fuse, wherein the performing of the read operation on the first fuse and the second fuse comprises: applying the high power supply voltage to the first bit line during a third duration while applying the low power supply voltage to a second bit line; electrically connecting the other ends of the first fuse and the second fuse with each other in response to a read voltage that is applied through a second word line; and detecting a change in a level of voltage pre-charging the first bit line.

DETAILED DESCRIPTION

Figure 1:
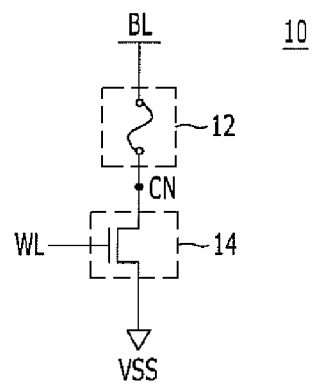
FIG. 1 illustrates a memory cell of a conventional semiconductor memory device of an electrical fuse scheme.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
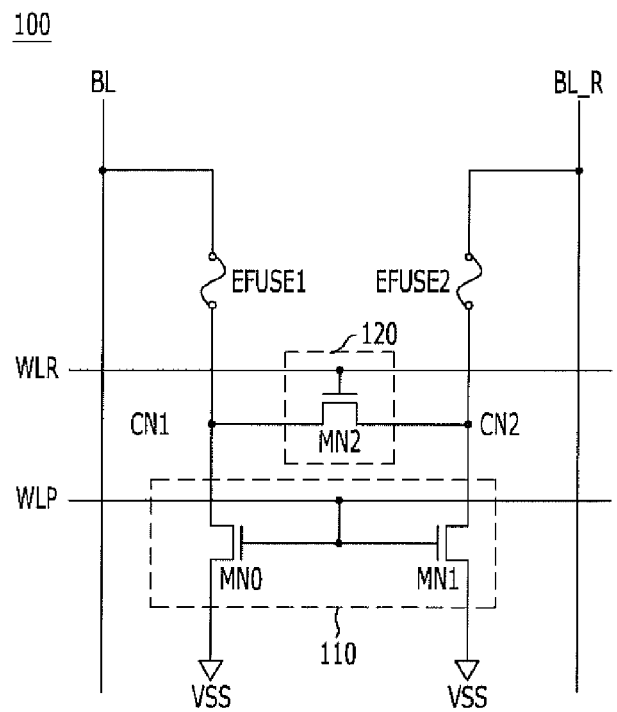
FIG. 2 illustrates a memory cell of a semiconductor memory device in accordance with an embodiment of the present invention.

FIG. 2 illustrates a memory cell of a semiconductor memory device in accordance with an embodiment of the present invention.

Referring to FIG. 2, a memory cell structure 100 includes a normal fuse EFUSE1, a redundant fuse EFUSE2, a program controller 110, and a read controller 120. The normal fuse EFUSE1 has its one end coupled with a normal bit line BL that inputs/outputs a normal data and the normal fuse EFUSE1 is programmed with the normal data. The redundant fuse EFUSE2 is provided to be paired with the normal fuse EFUSE1 and programmed with a redundant data corresponding to the normal data. The redundant fuse EFUSE2 has its one end coupled with a redundant bit line BL_R that inputs/outputs the redundant data. The program controller 110 is coupled with the other ends of the normal fuse EFUSE1 and the redundant fuse EFUSE2, and as a program voltage is applied through a program word line WLP, it performs a program operation on at least one among the normal fuse EFUSE1 and the redundant fuse EFUSE2. The read controller 120 is coupled with the other ends of the normal fuse EFUSE1 and the redundant fuse EFUSE2, and as a read voltage is applied through a read word line WLR, it performs a read operation on the data programmed in the normal fuse EFUSE1 and the redundant fuse EFUSE2.

The normal fuse EFUSE1 and the redundant fuse EFUSE2 are electrical fuses, and the electrical fuses are blown and electrically disconnected when a program current flows therethrough for a given time. For example, the electrical fuses have a resistance of approximately 50Ω to approximately 100Ω before a program operation, and after the program operation, the electrical fuses have a resistance of approximately over 100Ω.

The program controller 110 functions as a switching unit for electrically connecting the other ends of the normal fuse EFUSE1 and the redundant fuse EFUSE2 with a ground voltage VSS end in response to the program voltage applied through the program word line WLP. In other words, the program controller 110 includes a first NMOS transistor MN0 and a second NMOS transistor MN1. The first NMOS transistor MN0 includes a gate for receiving a program voltage and a drain-source path coupled between a first coupling node CN1 and the ground voltage VSS end. The second NMOS transistor MN1 includes a gate for receiving a program voltage and a drain-source path coupled between a second coupling node CN2 and the ground voltage VSS end.

Also, the read controller 120 functions as a switching unit for electrically connecting the other ends of the normal fuse EFUSE1 and the redundant fuse EFUSE2 with each other in response to the read voltage applied through the read word line WLR. In other words, the read controller 120 includes a third NMOS transistor MN2 which includes a gate for receiving a read voltage and a drain-source path coupled between the first coupling node CN1 and a second coupling node CN2.

As for the program voltage, a power supply voltage VDD or a pumping voltage VPP may be used, and as for the read voltage, the power supply voltage VDD may be used.

Hereinafter, a method for driving the memory cell structure 100 of a semiconductor memory device having the above-described in accordance with an embodiment of the present invention is described with reference to FIGS. 3A to 4.

Figure 3A:
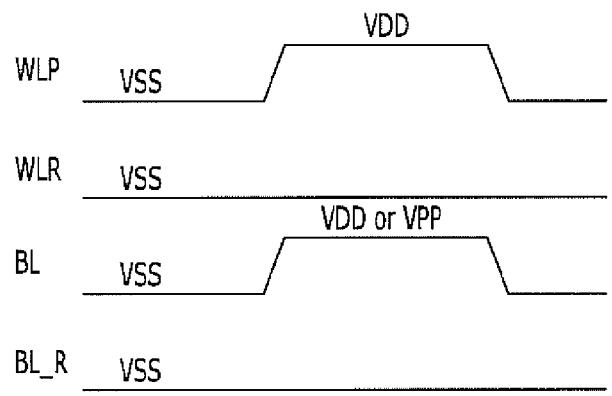
FIGS. 3A and 3B are timing diagrams exemplarily describing a program operation in a method for driving a memory cell of the semiconductor memory device shown in FIG. 2.
Figure 3B:
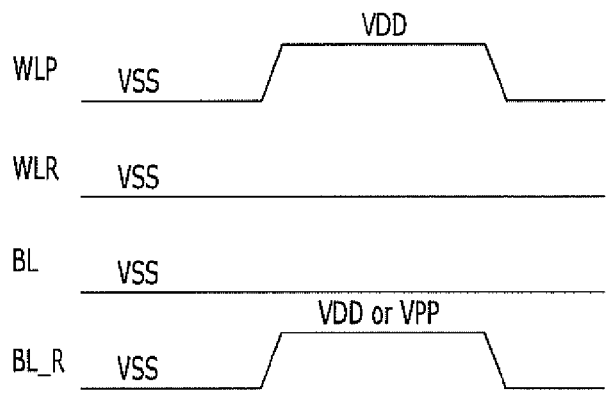

FIGS. 3A and 3B are timing diagrams exemplarily describing a program operation in a method for driving a memory cell of the semiconductor memory device shown in FIG. 2. The normal fuse EFUSE1 (or the redundant fuse EFUSE2) may be programmed to be one of the conductive state and the highly resistive state. A process of programming the normal fuse EFUSE1 to be in the highly resistive state is described as an example.

Referring to FIG. 3A, a first program process for programming the normal fuse EFUSE1 includes applying a power supply voltage VDD or a pumping voltage VPP to the one end of the normal fuse EFUSE1 through the normal bit line BL during a first duration, and applying a ground voltage VSS to the other end of the normal fuse EFUSE1 during the first duration in response to a program voltage of a power supply voltage VDD level that is applied through the program word line WLP. As a result, a program current flows through the normal fuse EFUSE1, and as the program current flows for a given time, the normal fuse EFUSE1 is electrically disconnected.

Referring to FIG. 3B, a second program process for programming the redundant fuse EFUSE2 includes applying the power supply voltage VDD or the pumping voltage VPP to the one end of the redundant fuse EFUSE2 through the redundant bit line BL_R during a second duration after the first program process, and applying the ground voltage VSS to the other end of the redundant fuse EFUSE2 during the second duration in response to a program voltage of the power supply voltage VDD level that is applied through the program word line WLP. As a result, a program current flows through the redundant fuse EFUSE2, and as the program current flows for a given time, the redundant fuse EFUSE2 is electrically disconnected.

Although the above embodiment illustrates the normal fuse EFUSE1 and the redundant fuse EFUSE2 sequentially programmed through the first and second program processes, the scope of the present invention is not limited to it, and the normal fuse EFUSE1 and the redundant fuse EFUSE2 may be simultaneously programmed to shorten the process time. In other words, the power supply voltage VDD or the pumping voltage VPP is applied to the normal bit line BL and the redundant bit line BL_R during a first duration simultaneously, and the ground voltage VSS is applied to the other ends of the normal fuse EFUSE1 and the redundant fuse EFUSE2 during the first duration in response to the program voltage of the power supply voltage VDD level that is applied through the program word line WLP. Accordingly, a program current flows through the normal fuse EFUSE1 and the redundant fuse EFUSE2 simultaneously, and as the program current flows for a given time, the normal fuse EFUSE1 and the redundant fuse EFUSE2 are electrically disconnected individually.

Here, to program the normal fuse EFUSE1 and the redundant fuse EFUSE2, the power supply voltage VDD or the pumping voltage VPP is applied to the normal bit line BL and the redundant bit line BL_R. To enhance fuse cutting efficiency, a pumping voltage VPP that is higher than the power supply voltage VDD may be used.

Figure 4:
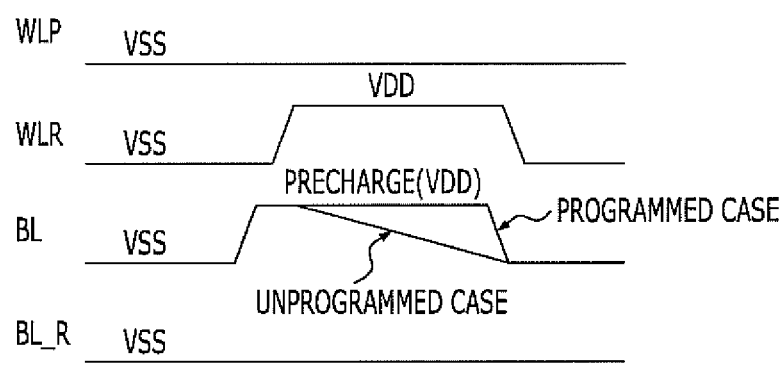
FIG. 4 is a timing diagram exemplarily describing a read operation in a method for driving a memory cell of the semiconductor memory device shown in FIG. 2.

FIG. 4 is a timing diagram exemplarily describing a read operation in a method for driving a memory cell of the semiconductor memory device shown in FIG. 2.

Referring to FIG. 4, the read operation includes a pre-charge process of applying the power supply voltage VDD to the normal bit line BL, while applying the ground voltage VSS to the redundant bit line BL_R, a redundancy process of electrically connecting the other ends of the normal fuse EFUSE1 and the redundant fuse EFUSE2 in response to a read voltage of the power supply voltage VDD level that is applied through the read word line WLR, and a data output process of detecting a change in the voltage level of the normal bit line BL.

In other words, when the redundancy process is performed while the normal bit line BL is pre-charged with the power supply voltage VDD, the normal fuse EFUSE1 and the redundant fuse EFUSE2 are serially connected. Here, when the normal fuse EFUSE1 and the redundant fuse EFUSE2 are programmed to be in the highly resistive state, the voltage level of the normal bit line BL is maintained as it is pre-charged, i.e., the power supply voltage VDD. On the other hand, when the normal fuse EFUSE1 and the redundant fuse EFUSE2 are programmed to be in the conductive state, the normal fuse EFUSE1 and the redundant fuse EFUSE2 are in a low resistance state. Therefore, as the normal bit line BL and the redundant bit line BL_R are electrically connected, the voltage of the pre-charged normal bit line BL is decreased to the ground voltage VSS. As described above, a change in the voltage level of the pre-charged normal bit line BL is sensed and a data of a logic low level or a logic high level is outputted depending on whether the normal fuse EFUSE1 and the redundant fuse EFUSE2 are programmed to be in the conductive or resistive state.

If both of the normal fuse EFUSE1 and the redundant fuse EFUSE2 are programmed, margin during a read operation is increased because the normal fuse EFUSE1 and the redundant fuse EFUSE2 are serially connected and thus the variation in the current before and after the program operation is great. According to an embodiment of the present invention, since a pair of fuses is programmed, a proper data may be outputted as long as any one of the pairs is properly programmed. When both of the pairs are properly programmed, margin of a read operation increases because the pair of the fuses is connected in serial and the variation in the current depending on the programmed data is great. As a result, failure rate in programming and reading a data is remarkably decreased and this leads to improved yield. The resistance value of an electrical fuse may decrease after it is programmed. However, since the two fuses are programmed, the margin of the resistance value may be obtained. Therefore, data reliability is improved. Moreover, since a semiconductor memory device is designed based on an electrical fuse, it may be used for a low-voltage process.

Although the above method for driving the memory cell structure 100 of a semiconductor memory device describes programming two fuses provided for each memory cell without conditions, the scope of the present invention is not limited to it and the present invention may include the following embodiment as well.

To briefly describe the entire process for driving the memory cell structure 100 of another embodiment, the normal fuse EFUSE1 is programmed alone and then examined to see if the normal fuse EFUSE1 is properly programmed or not through a test. It is decided whether to program the redundant fuse EFUSE2 or not based on the examination result of the normal fuse EFUSE1.

To be more specific, a first program process where the power supply voltage VDD or the pumping voltage VPP is applied to the normal bit line BL during the first duration and the ground voltage VSS is applied to the other end of the normal fuse EFUSE1 during the first duration in response to the program voltage of the power supply voltage VDD level that is applied through the program word line WLP is performed. As a result, a program current flows through the normal fuse EFUSE1, and as the program current flows for a given time, the normal fuse EFUSE1 is electrically disconnected.

Subsequently, a test process is performed to test whether the normal fuse EFUSE1 is properly programmed or not. When it turns out that the normal fuse EFUSE1 is improperly programmed in the test process, a second program process where the high power supply voltage is applied to a redundant bit line BL_R coupled with one end of the redundant fuse EFUSE2 during the second duration and the ground voltage VSS is applied to the other end of the redundant fuse EFUSE2 during the second duration in response to the program voltage that is applied through the program word line WLP is performed. When it turns out in the test process that the normal fuse EFUSE1 is properly programmed, the process of programming the redundant fuse EFUSE2 is omitted. The test process may be performed the same as the read process.

According to an embodiment of the present invention, a memory cell structure may be used for a low voltage process by adopting an electrical fuse scheme and have improved data reliability and yield characteristics by additionally including a redundant fuse in each memory cell.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
a first fuse having one end coupled with a first bit line and configured to be programmed with a data;
a second fuse having one end coupled with a second bit line and configured to be programmed with the data;
a program controller coupled with the other ends of the first fuse and the second fuse and configured to perform a program operation on at least one of the first fuse and the second fuse in response to a program voltage; and
a read controller coupled with the other ends of the first fuse and the second fuse and configured to perform a read operation on the first fuse and the second fuse in response to a read voltage,
wherein the program controller is configured to program the data in the first fuse and program the data in the second fuse in response to the data programmed in the first fuse.

2. The semiconductor memory device of claim 1, wherein the program voltage is applied through a first word line to the program controller.

3. The semiconductor memory device of claim 2, wherein the read voltage is applied through a second word line to the read controller.

4. The semiconductor memory device of claim 1, wherein the first fuse and the second fuse comprise electrical fuses disconnected in response to a set current flowing therethough.

5. A memory cell of a semiconductor memory device, comprising:
a first fuse including one end coupled with a first bit line;
a second fuse including one end coupled with a second bit line;
a first switching unit configured to electrically connect each of the other ends of the first fuse and the second fuse to a set voltage end in response to a program voltage that is applied through a first word line; and
a second switching unit configured to electrically connect the other ends of the first fuse and the second fuse with each other in response to a read voltage that is applied through a second word line,
wherein a ground voltage is supplied to the set voltage end.

6. The memory cell of claim 5, wherein the first switching unit includes:
a first transistor including a gate configured to receive the program voltage and a drain-source path coupled between the other end of the first fuse and the set voltage end; and
a second transistor including a gate configured to receive the program voltage and a drain-source path coupled between the other end of the second fuse and the set voltage end.

7. The memory cell of claim 5, wherein the second switching unit includes:
a third transistor including a gate configured to receive the read voltage and a drain-source path coupled between the other ends of the first and second fuses.

8. The memory cell of claim 5, wherein the program voltage comprises a power supply voltage or a pumping voltage.

9. The memory cell of claim 5, wherein the read voltage comprises a power supply voltage.

10. A method for driving a memory cell of a semiconductor memory device including a first fuse and a second fuse, comprising:
applying a high power supply voltage to a first bit line coupled with one end of the first fuse during a first duration, and applying a low power supply voltage to the other end of the first fuse during the first duration in response to a program voltage that is applied through a first word line; and
performing a read operation on the first fuse and the second fuse,
wherein the performing of the read operation on the first fuse and the second fuse comprises:
applying the high power supply voltage to the first bit line during a third duration while applying the low power supply voltage to a second bit line;
electrically connecting the other ends of the first fuse and the second fuse with each other in response to a read voltage that is applied through a second word line; and
detecting a change in a level of voltage pre-charging the first bit line.

11. The method of claim 10, further comprising:
applying the high power supply voltage to the second bit line coupled with one end of the second fuse during a second duration, and applying the low power supply voltage to the other end of the second fuse during the second duration in response to the program voltage that is applied through the first word line, after the first duration.

12. The method of claim 10, wherein during the first duration, the high power supply voltage is applied to the second bit line coupled with one end of the second fuse during the first duration and the low power supply voltage is applied to the other end of the second fuse during the first duration in response to the program voltage that is applied through the first word line.

13. The method of claim 10, further comprising:
testing whether the first fuse is programmed or not after the first duration; and
when the first fuse is abnormally programmed, applying the high power supply voltage to the second bit line coupled with one end of the second fuse during a second duration, and applying the low power supply voltage to the other end of the second fuse during the second duration in response to the program voltage that is applied through the first word line.

14. The method of claim 13, wherein the testing is performed the same as the performing of the read operation on the first fuse and the second fuse.

15. The method of claim 10, wherein the first fuse and the second fuse comprise electrical fuses disconnected in response to a set current flowing therethough.

16. The method of claim 10, wherein the program voltage comprises a power supply voltage or a pumping voltage.

17. The method of claim 10, wherein the read voltage comprises a power supply voltage.

18. The method of claim 10, wherein the high power supply voltage comprises a power supply voltage, and the low power supply voltage comprises a ground voltage.

19. A semiconductor memory device, comprising:
a first fuse having one end directly coupled to a first bit line and configured to be programmed with a data;
a second fuse having one end directly coupled to a second bit line and configured to be programmed with the data;
a program controller directly coupled to the other ends of the first fuse and the second fuse and configured to perform a program operation on at least one of the first fuse and the second fuse in response to a program voltage; and a read controller directly coupled to the other ends of the first fuse and the second fuse and configured to perform a read operation on the first fuse and the second fuse in response to a read voltage.

20. A memory cell of a semiconductor memory device, comprising:
- a first fuse including one end directly coupled to a first bit line;
- a second fuse including one end directly coupled to a second bit line;
- a first switching unit configured to electrically connect each of the other ends of the first fuse and the second fuse to a set voltage end in response to a program voltage that is applied through a first word line; and
- a second switching unit configured to electrically connect the other ends of the first fuse and the second fuse with each other in response to a read voltage that is applied through a second word line.

* * * * *